US010070567B2

(12) United States Patent
Chen et al.

(10) Patent No.: US 10,070,567 B2
(45) Date of Patent: Sep. 4, 2018

(54) SYSTEM FOR PRINTED CIRCUIT BOARD UNLOCKING AND AUTOMATED REFLOW CARRIER RECYCLING

(71) Applicant: ARRIS Enterprises LLC, Suwanee, GA (US)

(72) Inventors: Hung-Lueh Chen, Taipei (TW); Chun-Hau Teng, Taipei (TW); Hsiu-Lan Yen, Taipei (TW); Chen-Hsiang Chen, Taipei (TW); Tung-Tsan Hsu, Taipei (TW)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 15/621,414

(22) Filed: Jun. 13, 2017

(65) Prior Publication Data

US 2017/0359927 A1     Dec. 14, 2017

Related U.S. Application Data

(60) Provisional application No. 62/349,245, filed on Jun. 13, 2016.

(51) Int. Cl.
| | |
|---|---|
| *H05K 13/02* | (2006.01) |
| *B65G 37/02* | (2006.01) |
| *B65G 47/57* | (2006.01) |
| *B65G 47/53* | (2006.01) |
| *H05K 13/00* | (2006.01) |
| *B65G 37/00* | (2006.01) |

(52) U.S. Cl.
CPC ......... *H05K 13/0069* (2013.01); *B65G 37/00* (2013.01); *B65G 37/02* (2013.01); *B65G 47/53* (2013.01); *B65G 47/57* (2013.01); *H05K 13/0061* (2013.01)

(58) Field of Classification Search
CPC .......... H05K 13/0069; H05K 13/0061; H05K 13/02; B65G 37/00; B65G 37/02; B65G 47/53; B65G 47/57; B65G 2201/0267
See application file for complete search history.

(56) References Cited

U.S. PATENT DOCUMENTS

| | | | | |
|---|---|---|---|---|
| 5,321,885 | A * | 6/1994 | Hino | B23P 21/004 209/573 |
| 5,865,319 | A * | 2/1999 | Okuda | G01R 31/01 209/571 |
| 6,370,748 | B1 * | 4/2002 | Baccini | H05K 3/00 29/33 M |
| 9,095,086 | B2 * | 7/2015 | Peng | H05K 13/0061 |
| 2006/0090332 | A1 * | 5/2006 | Taban | G06K 13/07 29/748 |
| 2008/0221723 | A1 * | 9/2008 | Lee | H05K 13/0061 700/112 |
| 2012/0206732 | A1 * | 8/2012 | Sumi | H05K 13/0061 356/500 |

(Continued)

*Primary Examiner* — Mark A Deuble
(74) *Attorney, Agent, or Firm* — Bart A. Perkins

(57) ABSTRACT

In embodiments, a PCB reflow process may be carried out by the components of an automated system working together to separate PCBs from reflow carriers and transport the reflow carriers back to a previous station of the PCB reflow system. The automated reflow carrier recycling system that is described herein may include a clip unlocking mechanism, a PCB pickup mechanism, a shifter, one or more lifters, and one or more overhead conveyors.

5 Claims, 29 Drawing Sheets

(56) References Cited

U.S. PATENT DOCUMENTS

| | | | |
|---|---|---|---|
| 2012/0266457 A1* | 10/2012 | Hanamura | H05K 13/0061 29/739 |
| 2015/0197405 A1* | 7/2015 | Sakamoto | B65H 5/10 414/416.01 |
| 2015/0259017 A1* | 9/2015 | Laurence | B65G 17/12 414/222.05 |
| 2016/0007512 A1* | 1/2016 | Higashi | H05K 13/0061 29/832 |
| 2016/0016739 A1* | 1/2016 | Takano | H01L 21/02274 198/345.3 |
| 2016/0068341 A1* | 3/2016 | Hamada | B65G 9/004 198/343.1 |

\* cited by examiner

2830

SYSTEM FOR PRINTED CIRCUIT BOARD UNLOCKING AND AUTOMATED REFLOW CARRIER RECYCLING

CROSS REFERENCE TO RELATED APPLICATION

This application is a non-provisional application claiming the benefit of U.S. Provisional Application Ser. No. 62/349,245, entitled "System for Printed Circuit Board Unlocking and Automated Reflow Carrier Recycling," which was filed on Jun. 13, 2016, and is incorporated herein by reference in its entirety.

TECHNICAL FIELD

This disclosure relates to a system for printed circuit board unlocking and automated reflow carrier recycling.

BACKGROUND

Typically, the printed circuit board (PCB) reflow process is a laborious one. A production operator removes a reflow carrier from a conveyor, unscrews a clip to unlock a PCB in order to remove the PCB from the carrier, separates the PCB from the carrier, and transports the carriers to another station. Pins and clips will typically fall off of the carriers during transport as the carriers will hit each other when putting them into the transport vessel (i.e., baskets). Thus, carriers end up needing to be repaired periodically. Moreover, the bottom side of the PCBs usually make harmful contact with the carrier when undergoing manual separation from the carrier. Therefore, a need exists for improving the handling of components during the PCB reflow process.

BRIEF DESCRIPTION OF THE DRAWINGS

Like reference numbers and designations in the various drawings indicate like elements.

DETAILED DESCRIPTION

In embodiments, the PCB reflow process may be carried out by the components of an automated system working together to separate PCBs from reflow carriers and transport the reflow carriers back to a previous station of the PCB reflow system. The automated reflow carrier recycling system that is described herein may include a clip unlocking mechanism, a PCB pickup mechanism, a shifter, one or more lifters, and one or more overhead conveyors.

Figure 1:
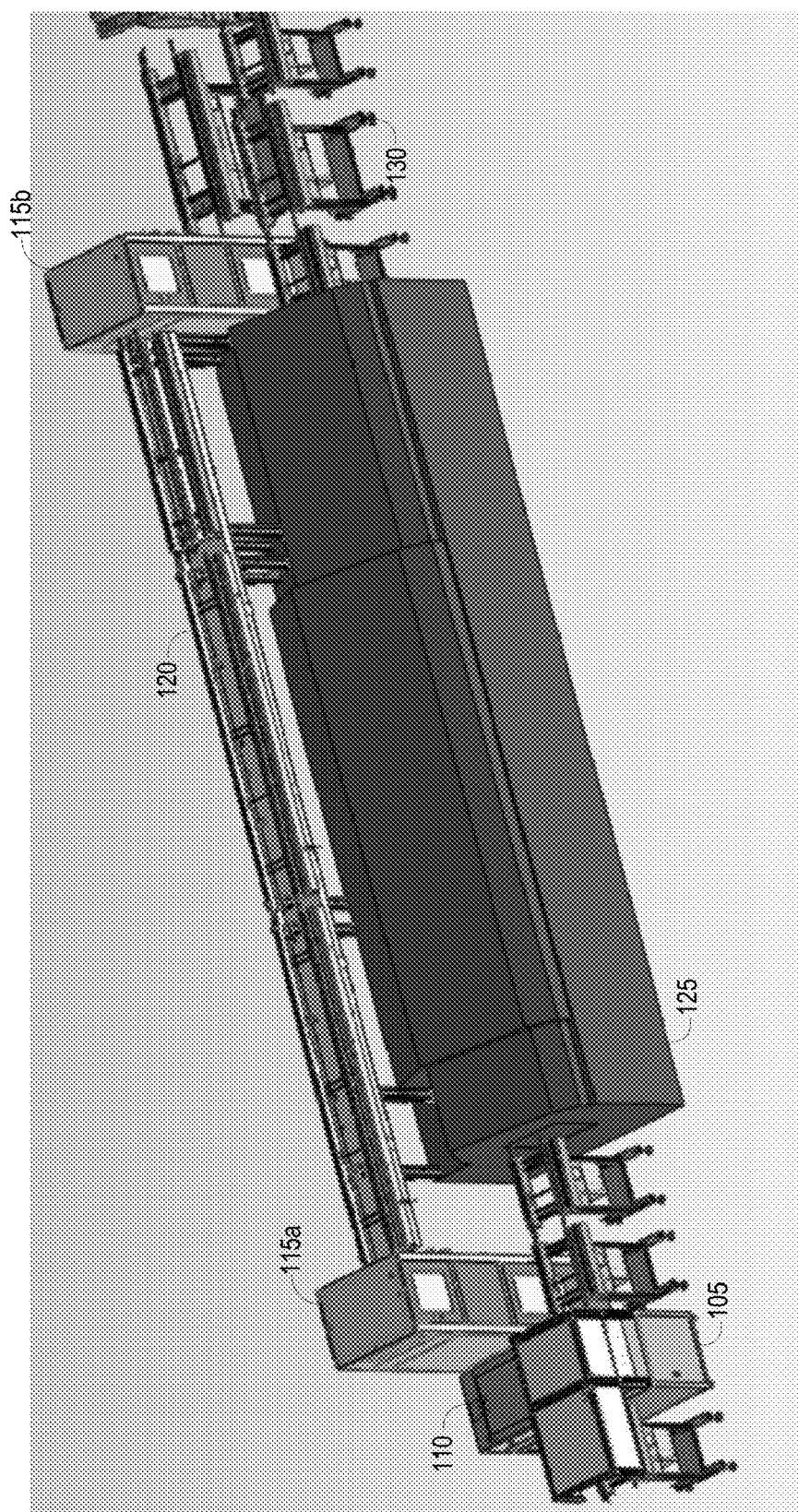
FIG. 1 shows an example embodiment of an automated reflow carrier recycling system.

FIG. 1 shows an example embodiment of an automated reflow carrier recycling system 100. The automated reflow carrier recycling system 100 may include a clip unlocking station 105, a PCB pickup station 110, one or more lifters 115, and one or more overhead conveyors 120. A PCB temporarily attached to a reflow carrier via a clip may enter a chamber 125 (e.g., a reflow chamber) at a first end (e.g., the end of the chamber 125 that is nearest to a staging area 130). At another end of the chamber 125, the clip may be unlocked/disengaged by a clip unlocking mechanism (e.g., a clip unlocking mechanism within the clip unlocking station 105). A PCB pickup mechanism within the PCB pickup station 110 may then remove the PCB from the reflow carrier. With the PCB and reflow carrier separated, the PCB may be moved to a next station for further preparation, and the reflow carrier may be transported to a previous station in the PCB reflow process. For example, a lifter 115 (e.g., lifter 115a) may carry the reflow carrier to an overhead conveyer 120, and the overhead conveyer 120 may transport the reflow carrier to a station that precedes the entry to the chamber 125. A second lifter 115 (e.g., lifter 115b) may return the reflow carrier from the overhead conveyer 120 to the staging area 130 where a PCB is attached to a reflow carrier.

Figure 2:
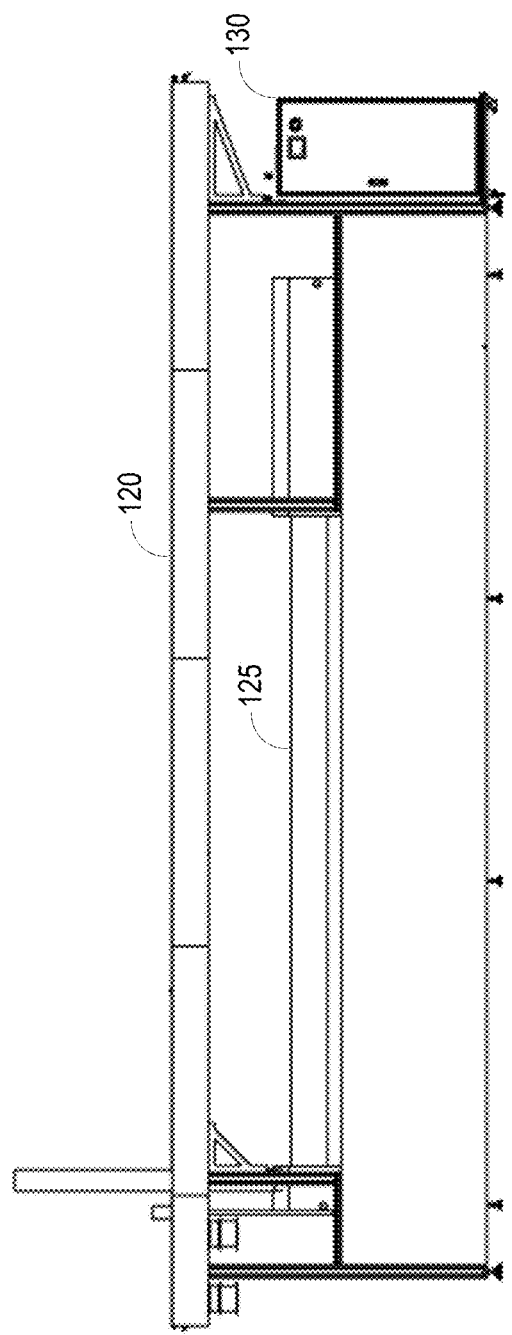
FIG. 2 shows a front elevation view of an example embodiment of an overhead conveyor and chamber.

FIG. 2 shows a front elevation view of an example embodiment of an overhead conveyor 120 and chamber 125. A PCB attached to a reflow carrier may enter the chamber 125 at the end of the chamber 125 that is nearest to a staging area 130, and the PCB attached to the reflow carrier may exit the chamber 125 at the opposite end of the chamber 125.

Once detached from the PCB, the reflow carrier may be lifted to the overhead conveyor 120 at the end opposite the staging area 130, and the overhead conveyor 120 may carry the reflow carrier to the staging area 130.

Figure 3:
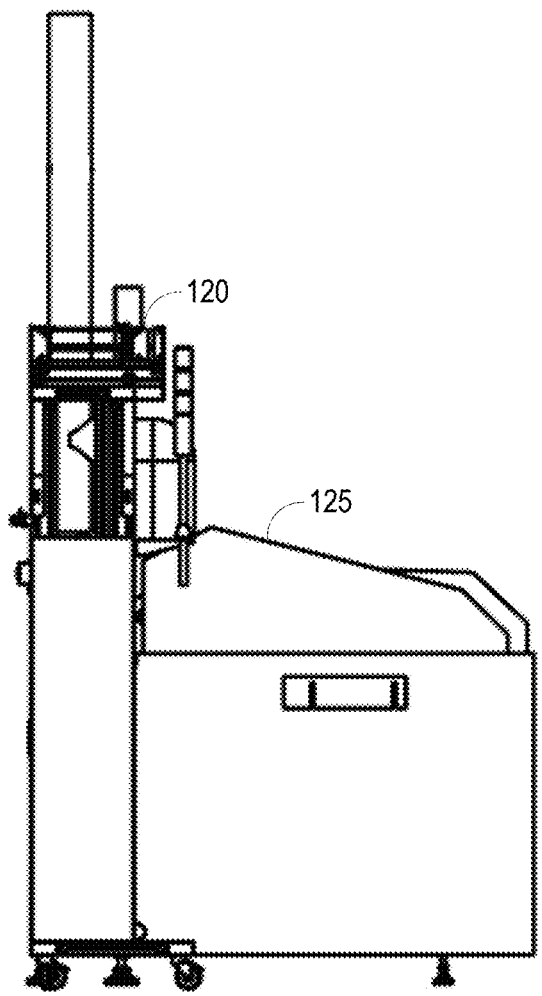
FIG. 3 shows a side elevation view of an example embodiment of an overhead conveyor and chamber.

FIG. 3 shows a side elevation view of an example embodiment of an overhead conveyor 120 and chamber 125.

Figure 4:
FIG. 4 shows an example embodiment of a section of an overhead conveyor.

FIG. 4 shows an example embodiment of a section of an overhead conveyor 120. The overhead conveyor 120 may include one or more transport surfaces 405, wherein the transport surfaces 405 support a reflow carrier that is being moved along the overhead conveyor 120. For example, the transport surfaces 405 may be belts or any other surface operable to provide a surface having enough friction to move the reflow carrier along the overhead conveyor 120. It will be appreciated by those skilled in the relevant art that movement of the transport surfaces 405 may be driven by various mechanisms. For example, the transport surfaces 405 may be moved by a belt, chain, or other mechanism.

Figure 5:
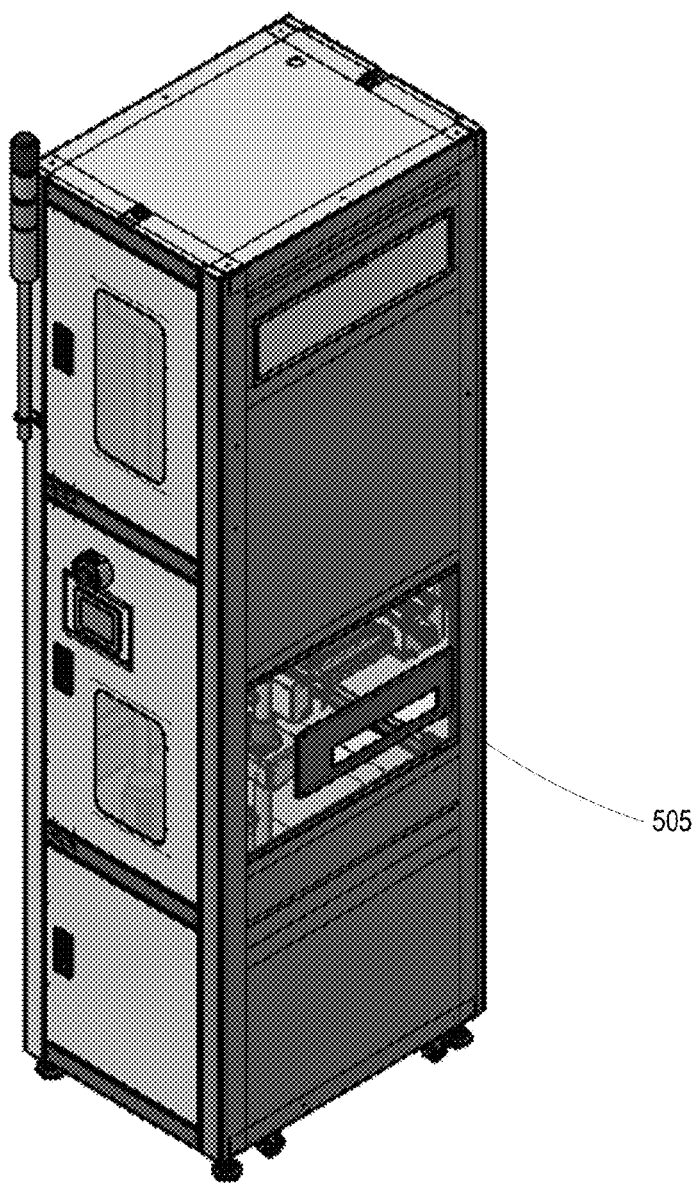
FIG. 5 shows an example embodiment of a lifter.

FIG. 5 shows an example embodiment of a lifter 115. The lifter 115 may be an enclosure and may include a slot 505 through which a reflow carrier may be passed. For example, a reflow carrier from which a PCB has been removed may enter the lifter 115 through slot 305, and the reflow carrier may exit a slot 505 after returning to a staging area 130 of FIG. 1 via an overhead conveyor 120 of FIG. 1.

Figure 6:
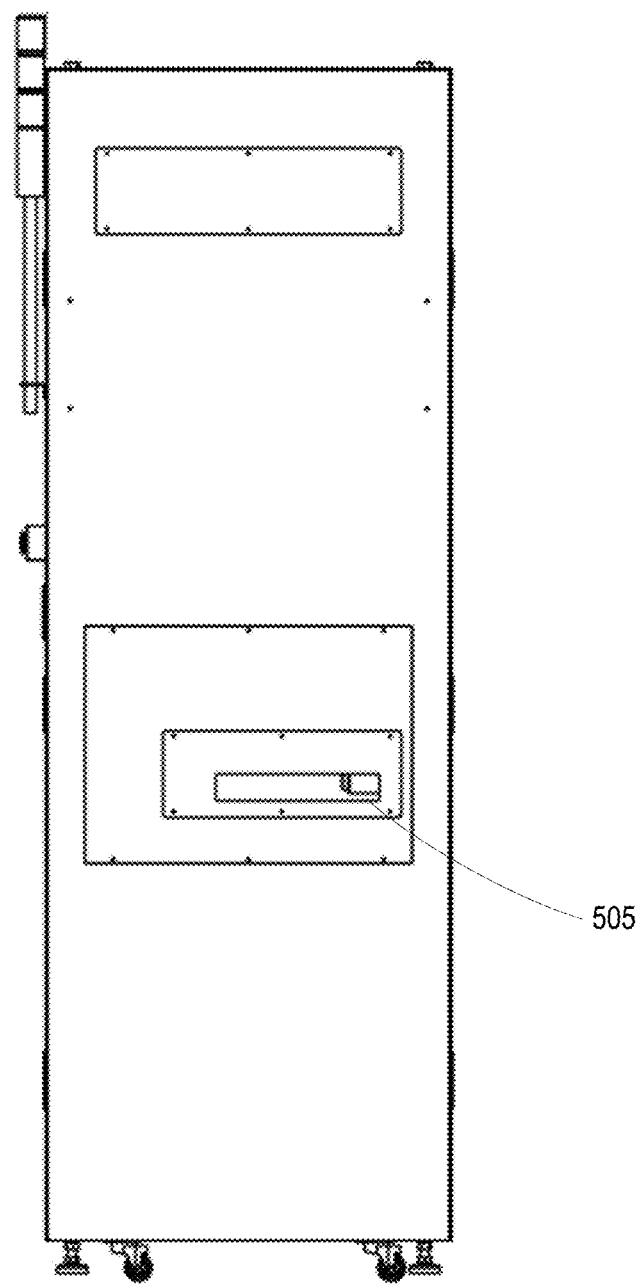
FIG. 6 shows a side elevation view of an example embodiment of a lifter.

FIG. 6 shows a side elevation view of an example embodiment of a lifter 115. The lifter may include a slot 505 through which a reflow carrier may be passed. For example, a reflow carrier from which a PCB has been removed may enter the lifter 115 through slot 505, and the reflow carrier may exit a slot 505 after returning to a staging area 130 of FIG. 1 via an overhead conveyor 120 of FIG. 1.

Figure 7:
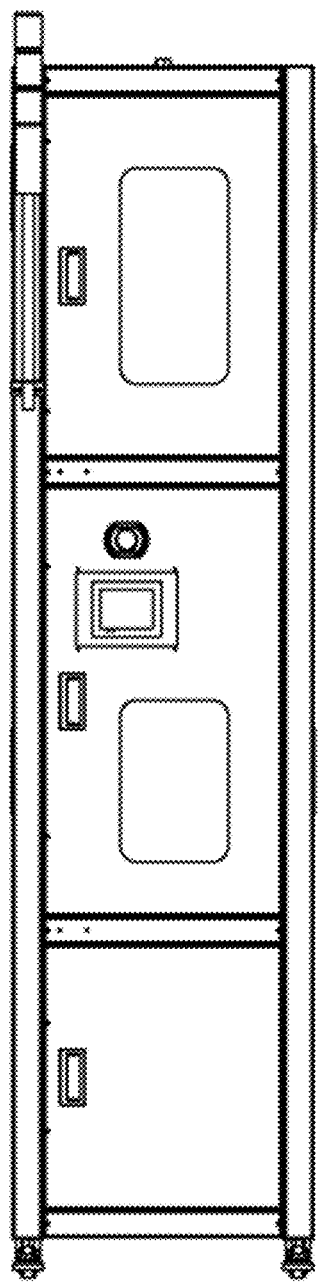
FIG. 7 shows a front elevation view of an example embodiment of a lifter.

FIG. 7 shows a front elevation view of an example embodiment of a lifter 115.

Figure 8:
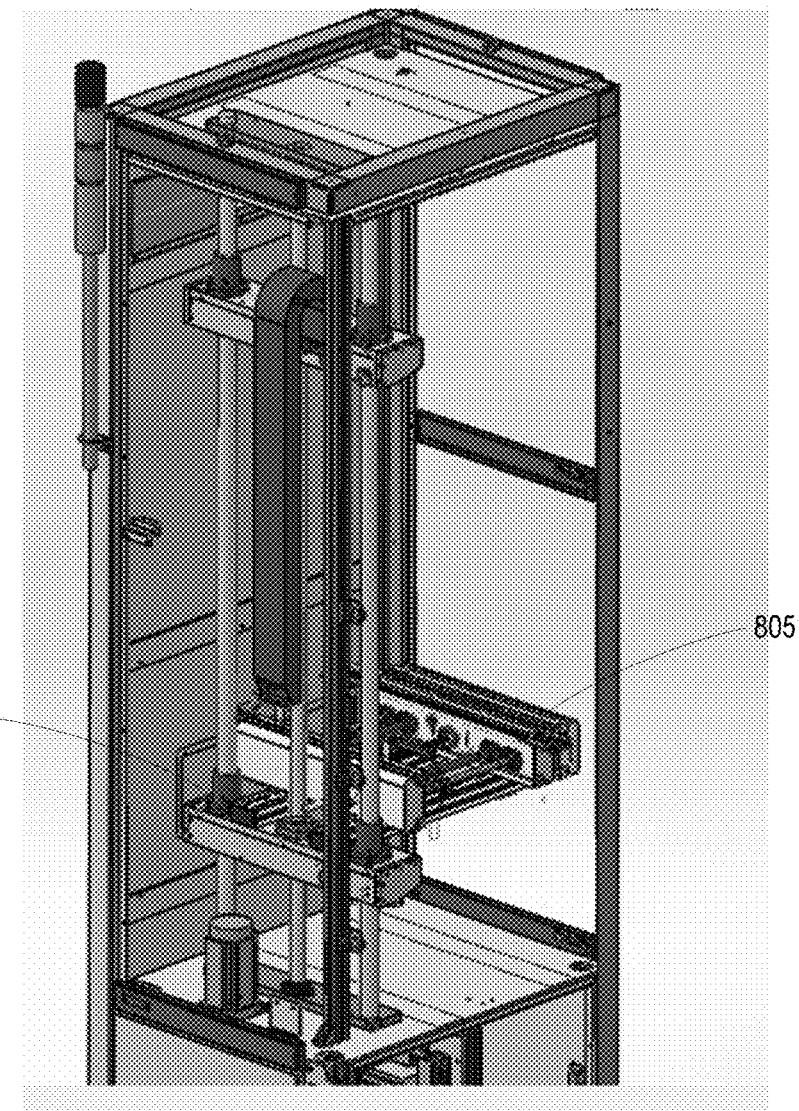
FIG. 8 shows an internal view of an example embodiment of a lifter.

FIG. 8 shows an internal view of an example embodiment of a lifter 115. In embodiments, a lifter 115 may include a platform 805 that has a surface designed to support a reflow carrier. A reflow carrier may be placed onto the platform 805, and the platform 805 may be raised or lowered to or from an overhead conveyor 120 of FIG. 1. It will be appreciated by one skilled in the relevant art that various mechanisms may be utilized to raise or lower the platform 805. For example, a lifting mechanism 810 may be a hydraulic, mechanical (e.g., belt or chain driven), or other type of mechanism used to move the platform 805.

Figure 9:
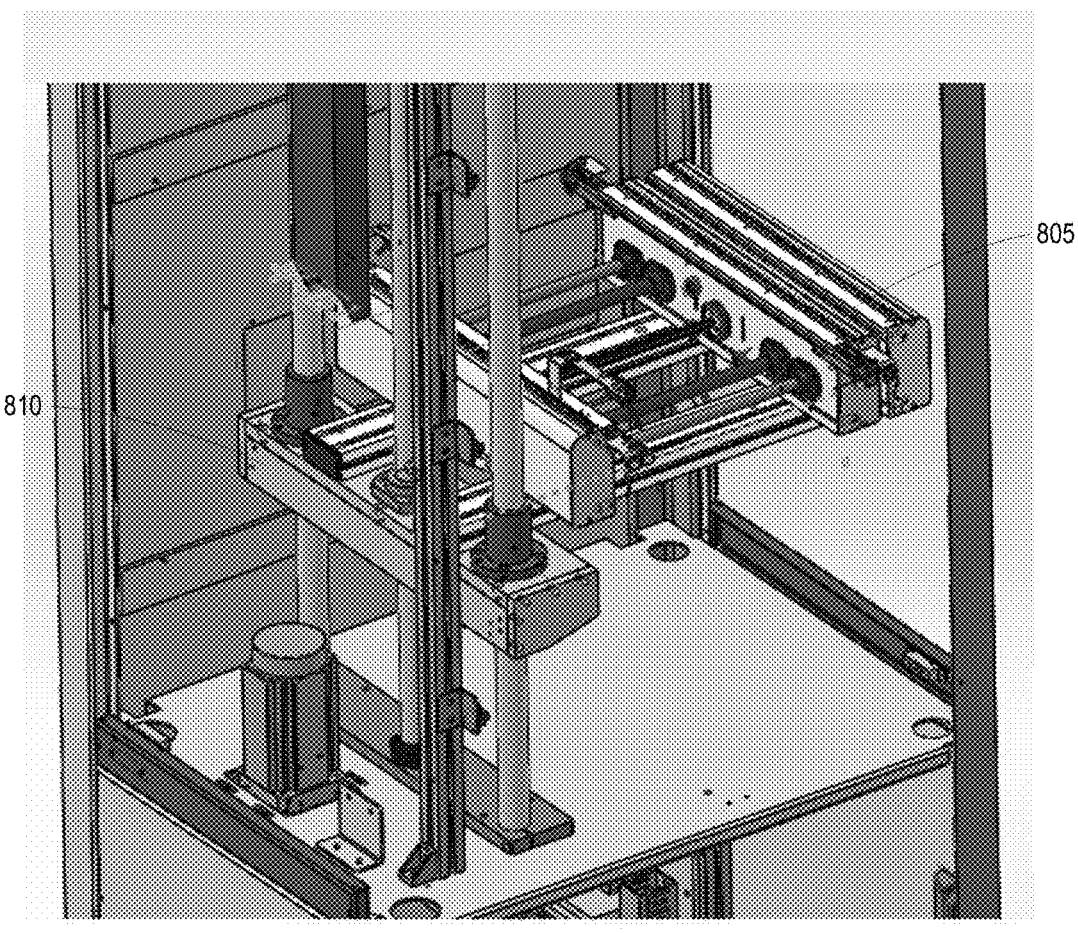
FIG. 9 shows an example embodiment of a platform.

FIG. 9 shows an example embodiment of a platform 805. The platform 805 may be raised or lowered by a lifting mechanism 810.

Figure 10:
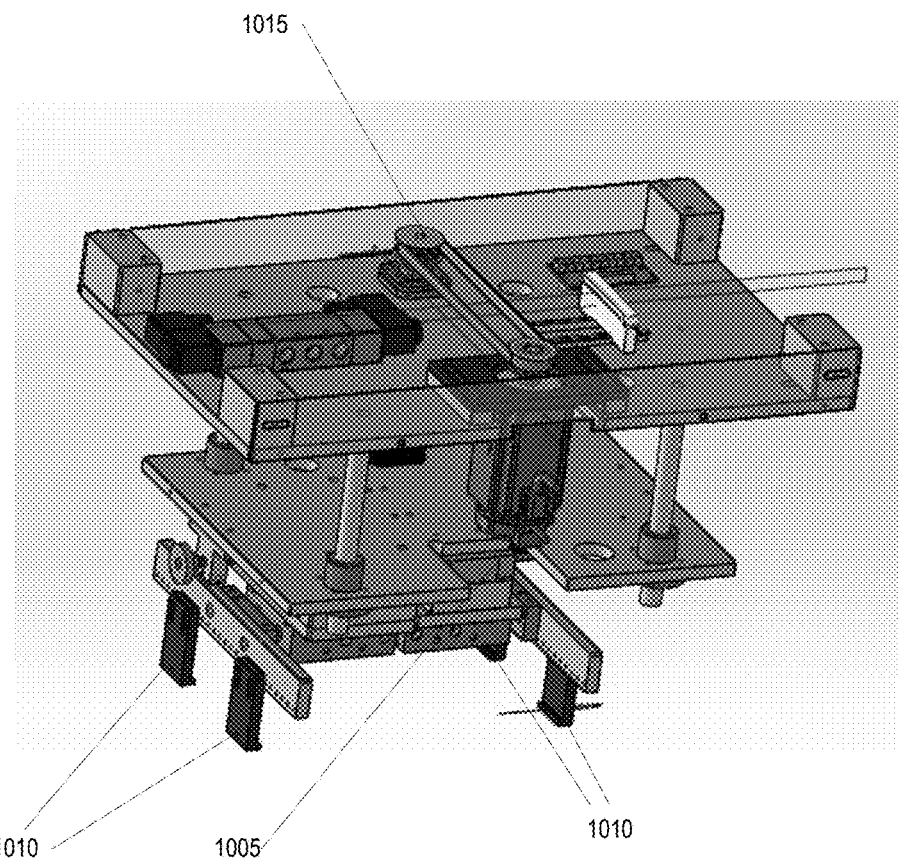
FIG. 10 shows a top perspective view of an example embodiment of a pickup.

FIG. 10 shows a top perspective view of an example embodiment of a pickup 1000. The pickup 1000 may be within a PCB pickup station 110 of FIG. 1. The pickup 1000 may include a gripper 1005 that may be lifted, raised, and rotated to move a reflow carrier away from a PCB from which the reflow carrier has been removed. One or more PCB retainers 1010 may be utilized to hold a PCB from which a reflow carrier has been removed. In embodiments, the gripper 1005 may be rotated utilizing a belt and pulley system 1015. It will be appreciated by those skilled in the relevant art that various other mechanisms may be utilized to rotate the gripper 1005.

Figure 11:
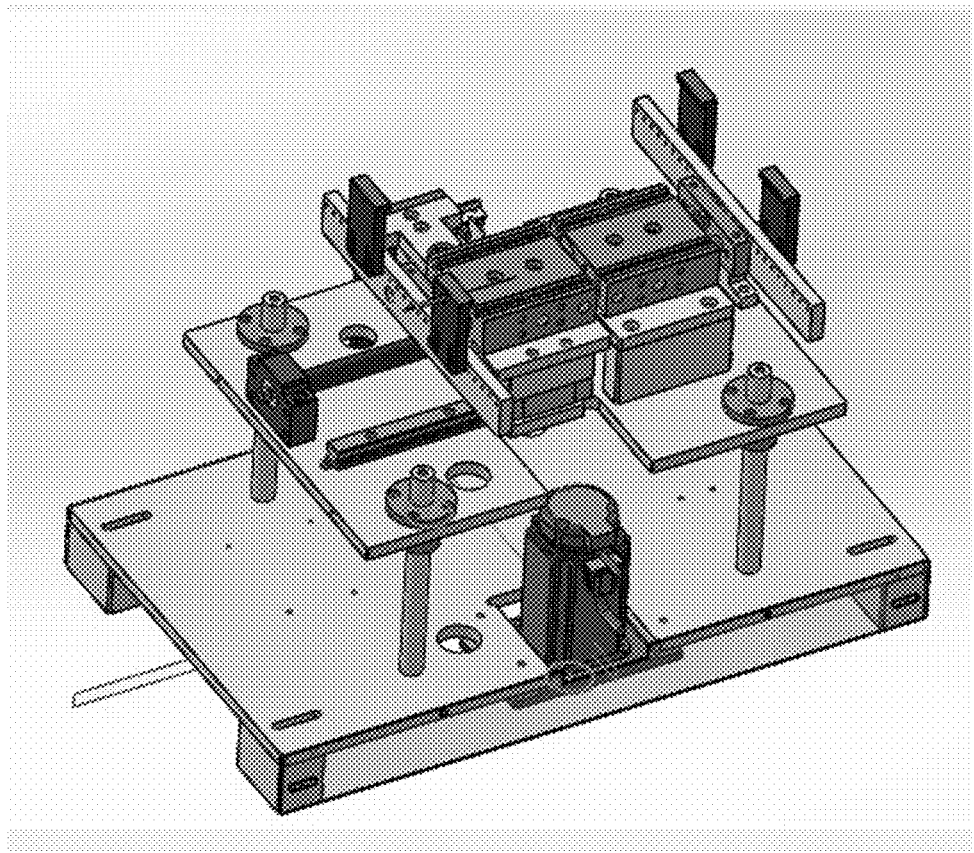
FIG. 11 shows a bottom perspective view of an example embodiment of a pickup.

FIG. 11 shows a bottom perspective view of an example embodiment of a pickup 1000.

Figure 12:
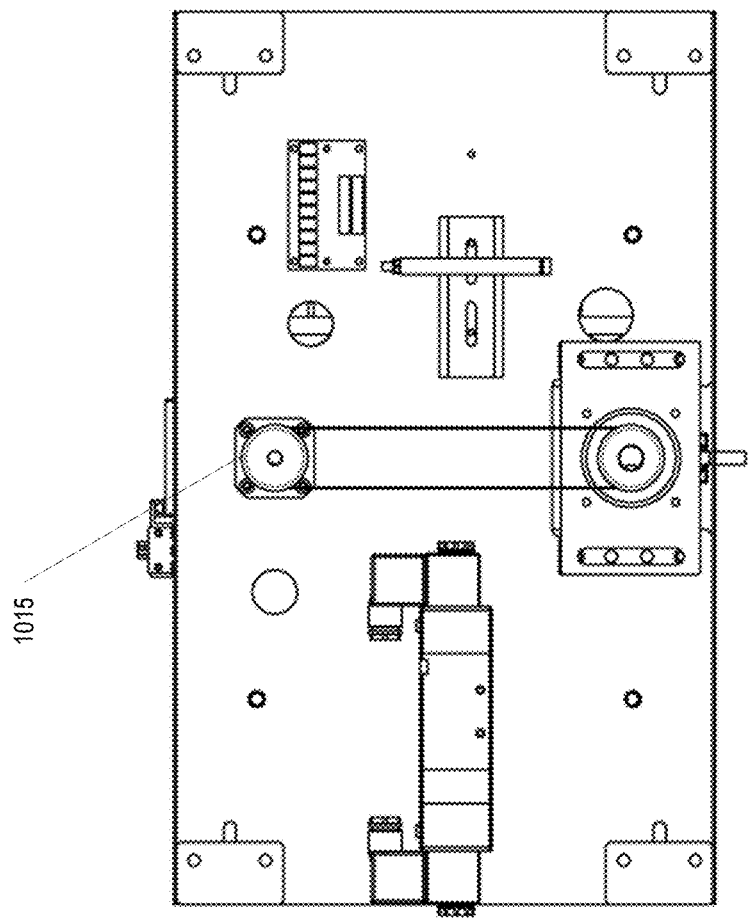
FIG. 12 shows a top elevation view of an example embodiment of a pickup.

FIG. 12 shows a top elevation view of an example embodiment of a pickup 1000. A belt and pulley system 1015 may be utilized to rotate a gripper 1005 of FIG. 5.

Figure 13:
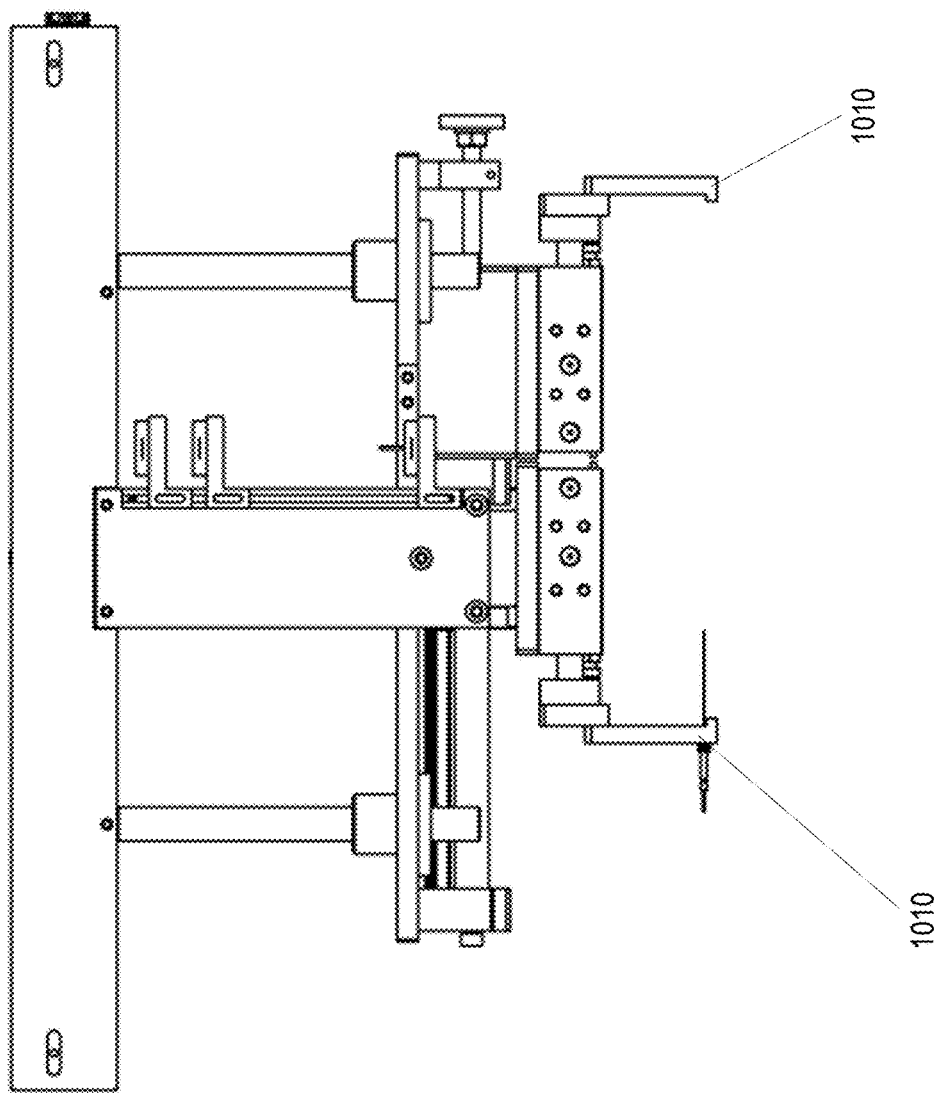
FIG. 13 shows a front elevation view of an example embodiment of a pickup.

FIG. 13 shows a front elevation view of an example embodiment of a pickup 1000. The pickup 1000 may include one or more PCB retainers 1010 may be utilized to hold a PCB from which a reflow carrier has been removed.

Figure 14:
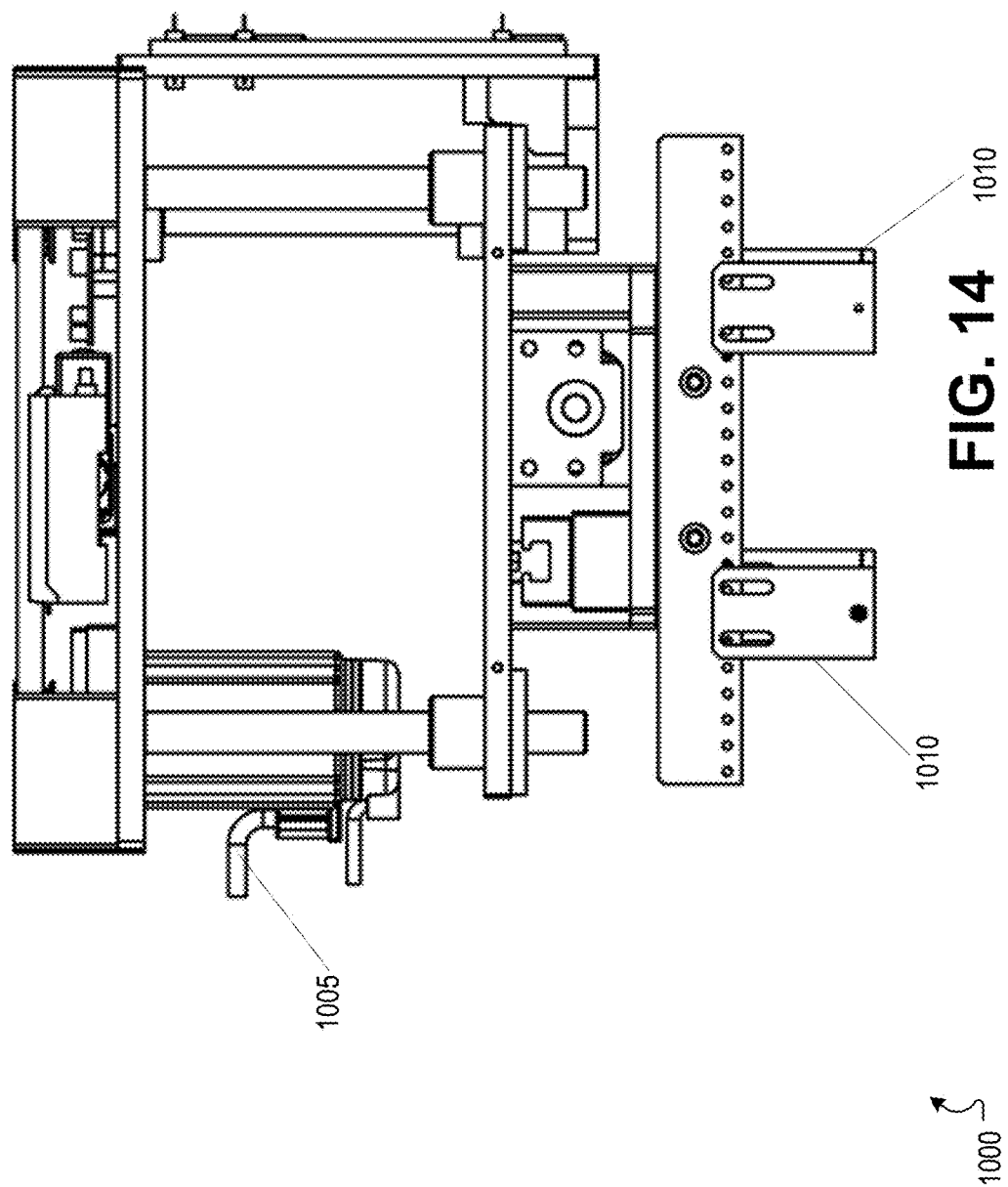
FIG. 14 shows a side elevation view of an example embodiment of a pickup.

FIG. 14 shows a side elevation view of an example embodiment of a pickup 1000. The pickup 1000 may include a gripper 1005 that may be lifted, raised, and rotated to move a reflow carrier away from a PCB from which the reflow carrier has been removed. One or more PCB retainers 1010 may be utilized to hold a PCB from which a reflow carrier has been removed.

Figure 15:
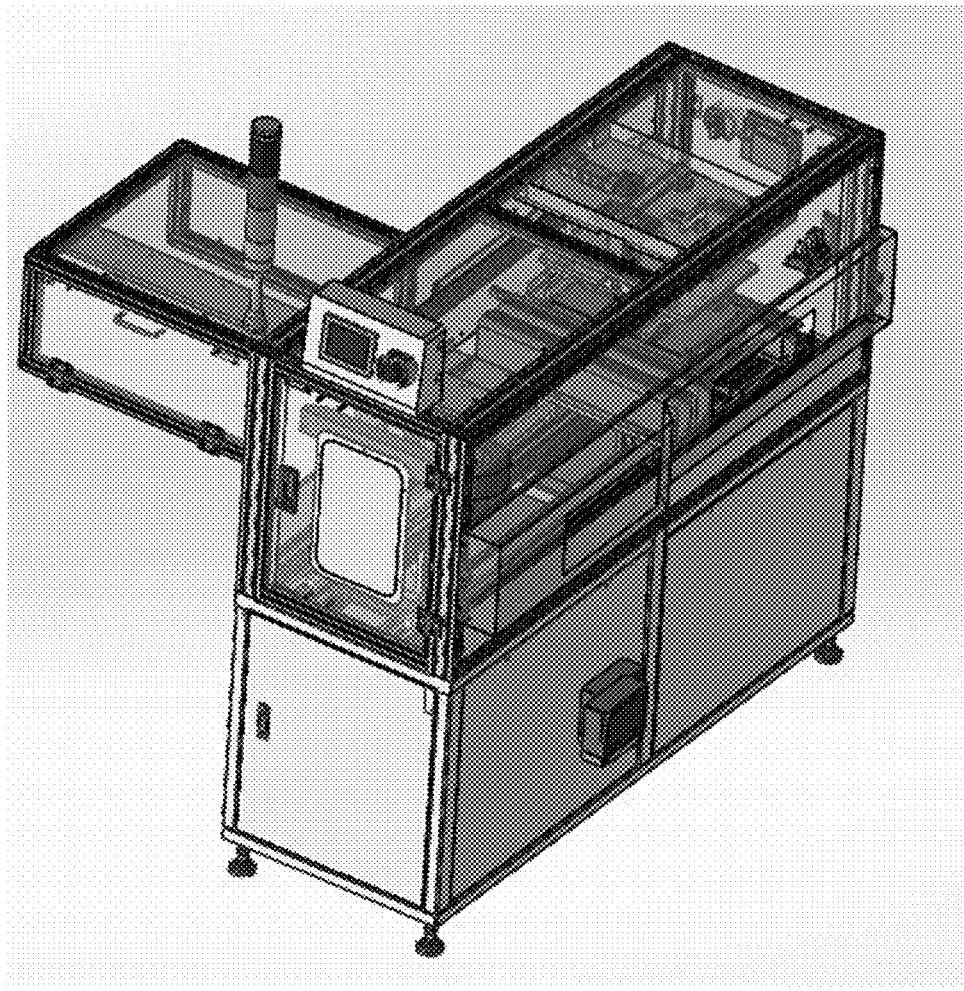
FIG. 15 shows an example embodiment of a PCB pickup station.

FIG. 15 shows an example embodiment of a PCB pickup station 110.

Figure 16:
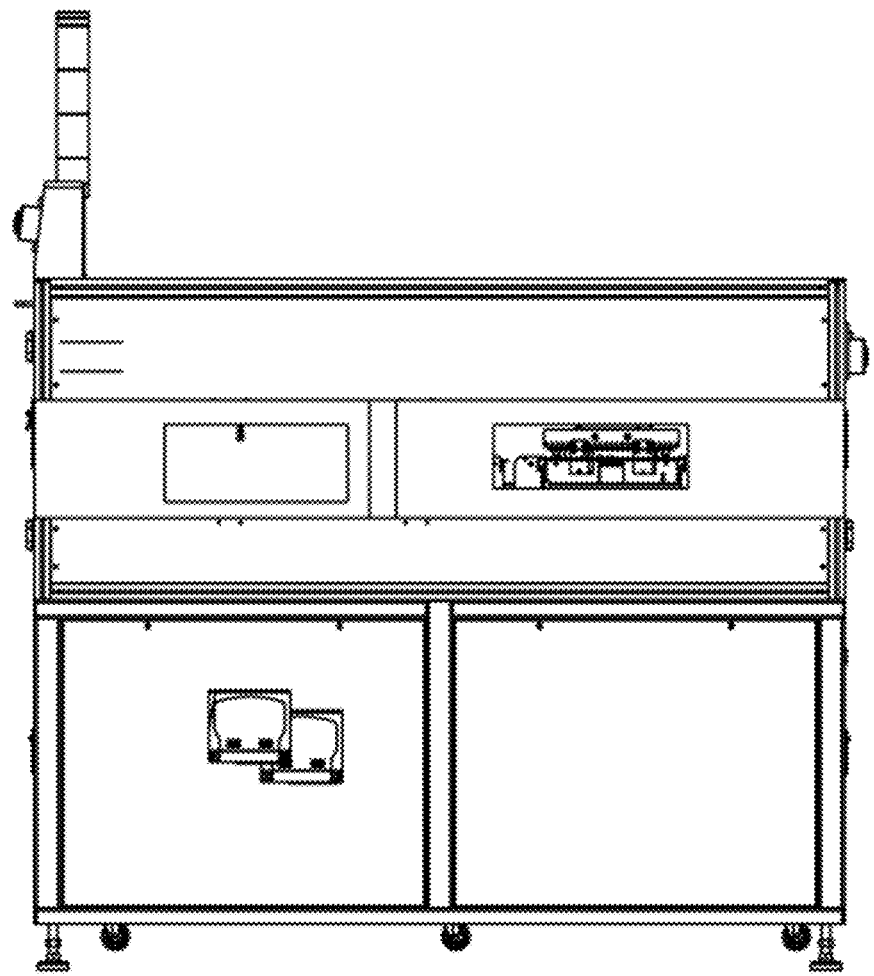
FIG. 16 shows a front elevation view of an example embodiment of a PCB pickup station.

FIG. 16 shows a front elevation view of an example embodiment of a PCB pickup station 110.

Figure 17:
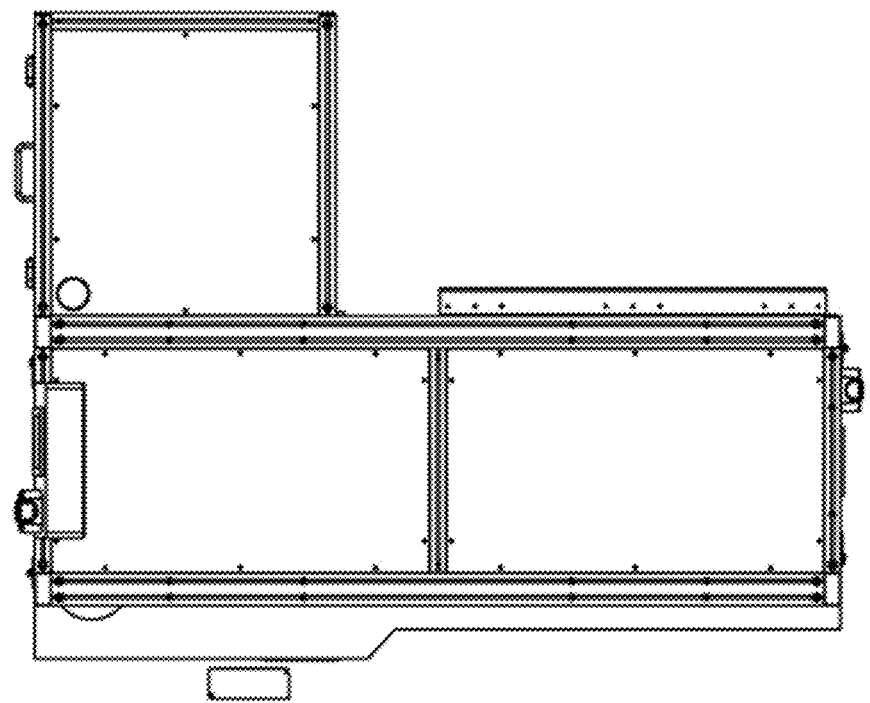
FIG. 17 shows a top elevation view of an example embodiment of a PCB pickup station.

FIG. 17 shows a top elevation view of an example embodiment of a PCB pickup station 110.

Figure 18:
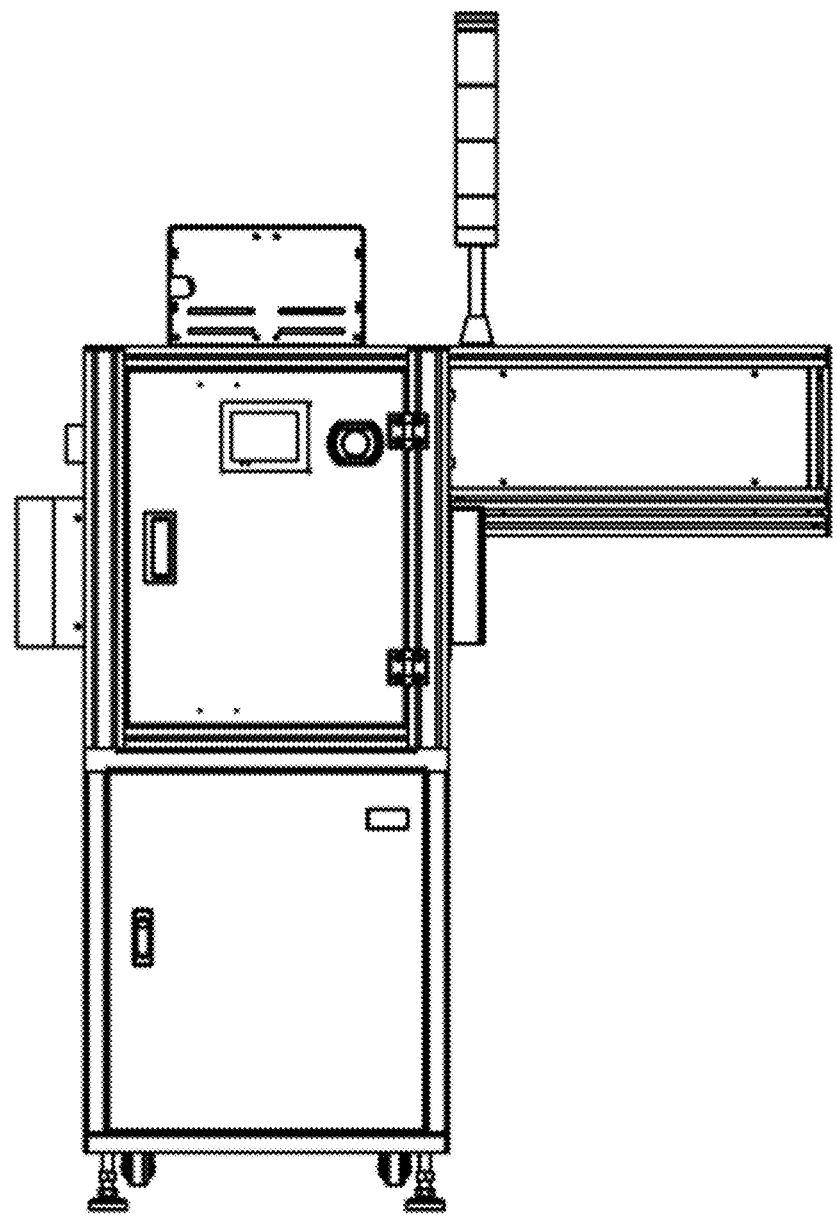
FIG. 18 shows a side elevation view of an example embodiment of a PCB pickup station.

FIG. 18 shows a side elevation view of an example embodiment of a PCB pickup station 110.

Figure 19:
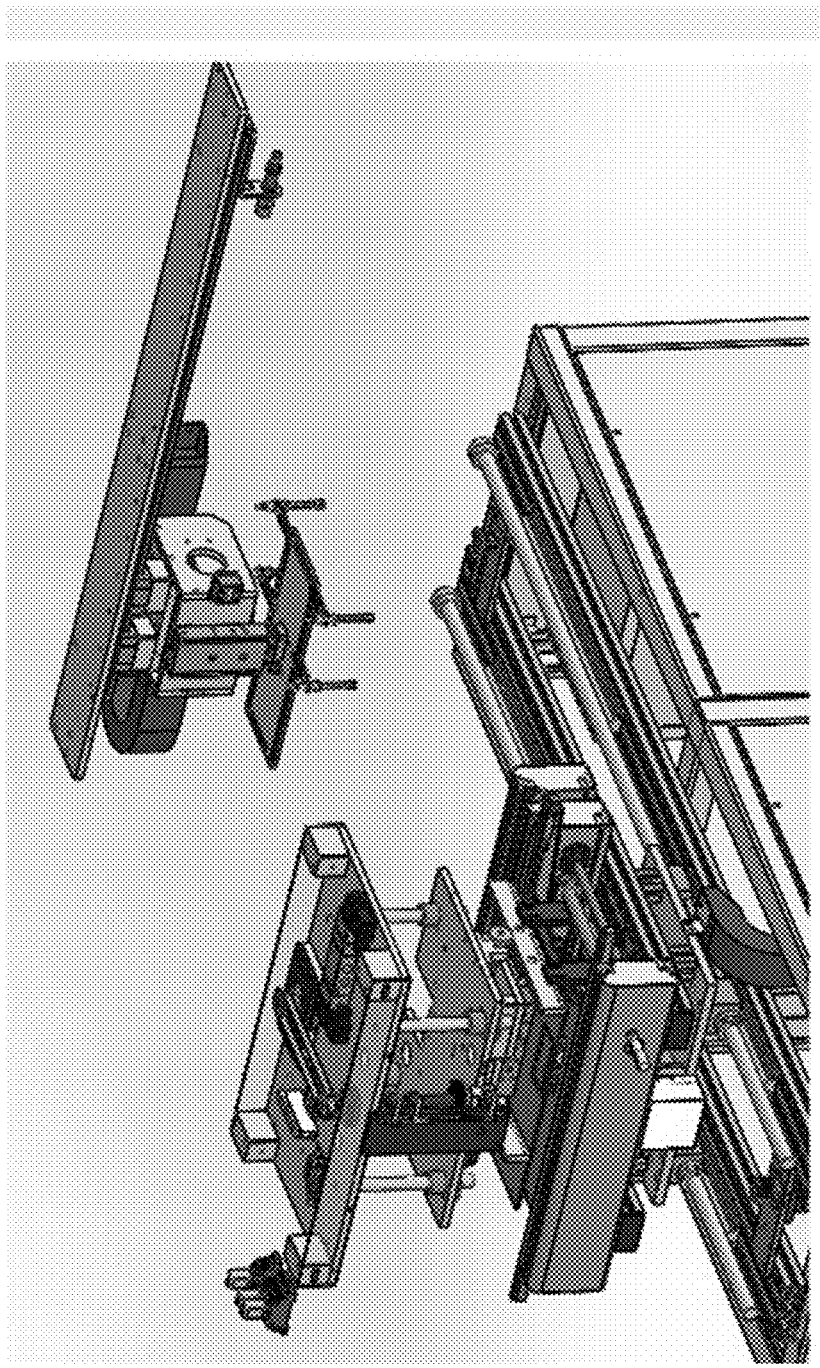
FIG. 19 shows an internal view of an example embodiment of a PCB pickup station.

FIG. 19 shows an internal view of an example embodiment of a PCB pickup station 110.

Figure 20:
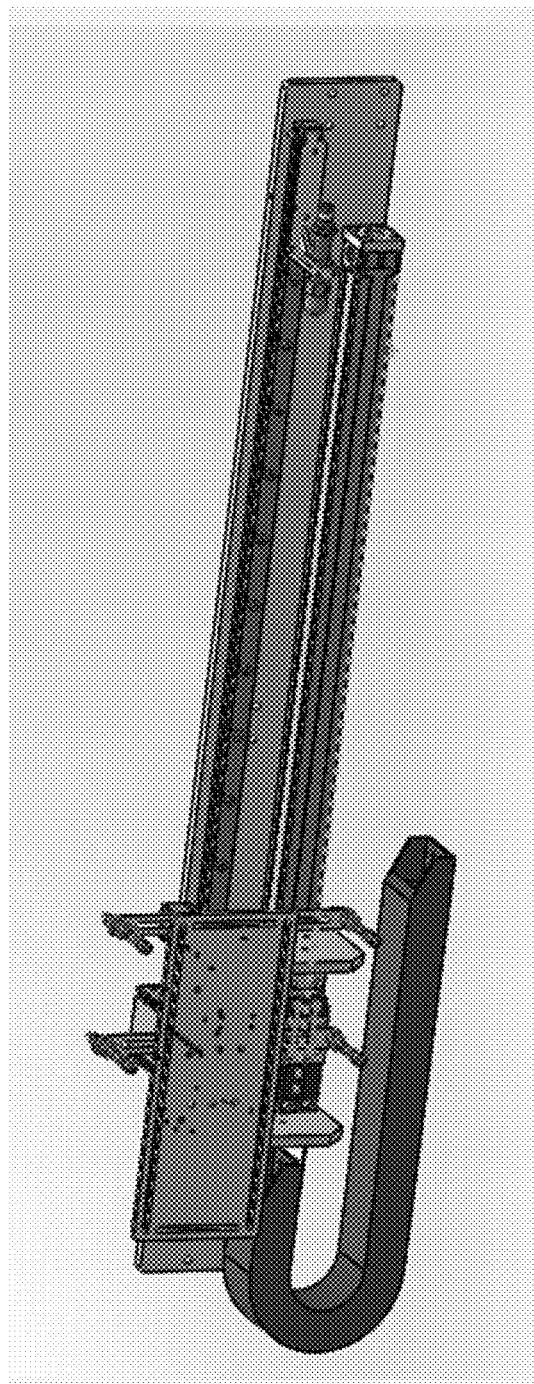
FIG. 20 shows an example embodiment of a shifter.

FIG. 20 shows an example embodiment of a shifter 2000. In embodiments, a shifter 2000 may move a PCB away from a reflow carrier that has been removed from the PCB.

Figure 21:
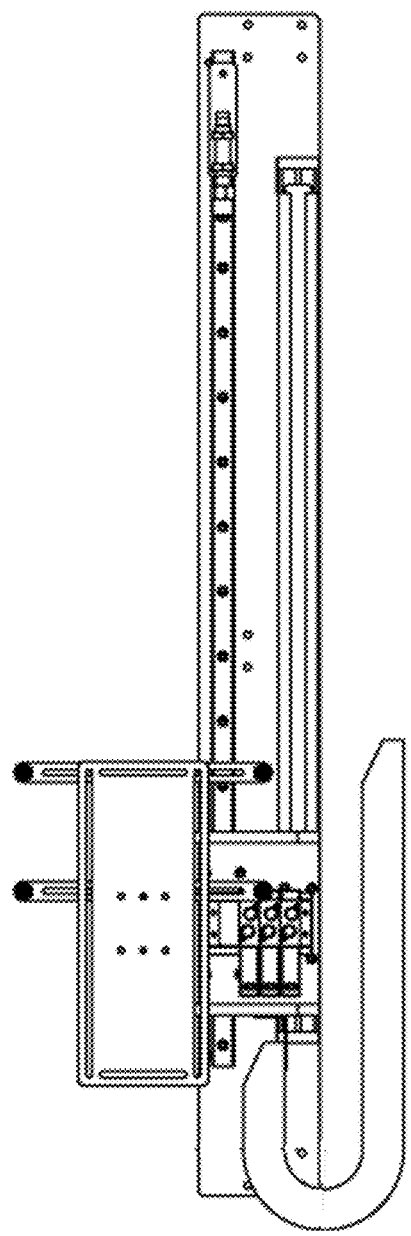
FIG. 21 shows a front elevation view of an example embodiment of a shifter.

FIG. 21 shows a front elevation view of an example embodiment of a shifter 2000.

Figure 22:
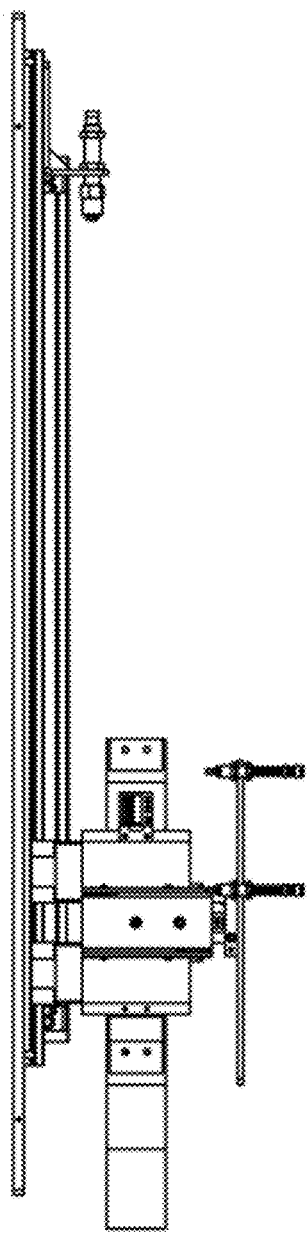
FIG. 22 shows a top elevation view of an example embodiment of a shifter.

FIG. 22 shows a top elevation view of an example embodiment of a shifter 2000.

Figure 23:
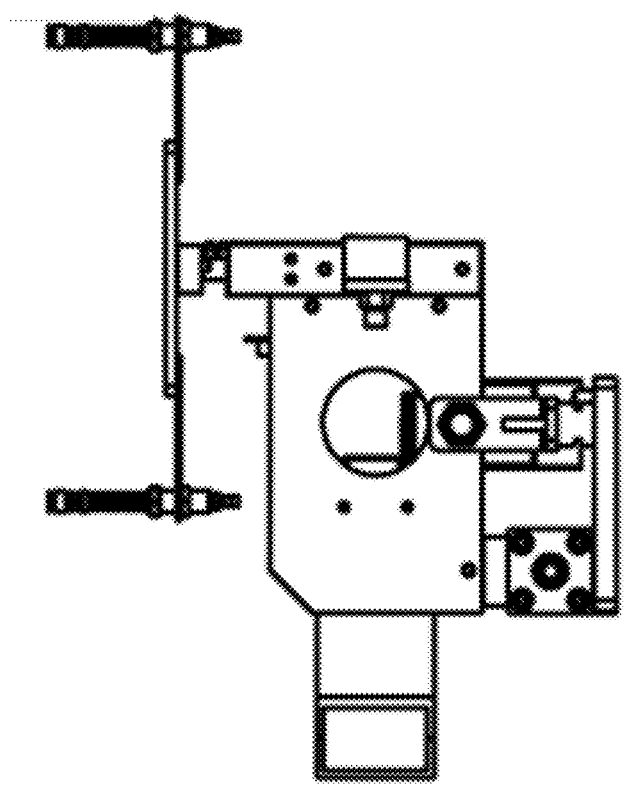
FIG. 23 shows a side elevation view of an example embodiment of a shifter.

FIG. 23 shows a side elevation view of an example embodiment of a shifter 2000.

Figure 24:
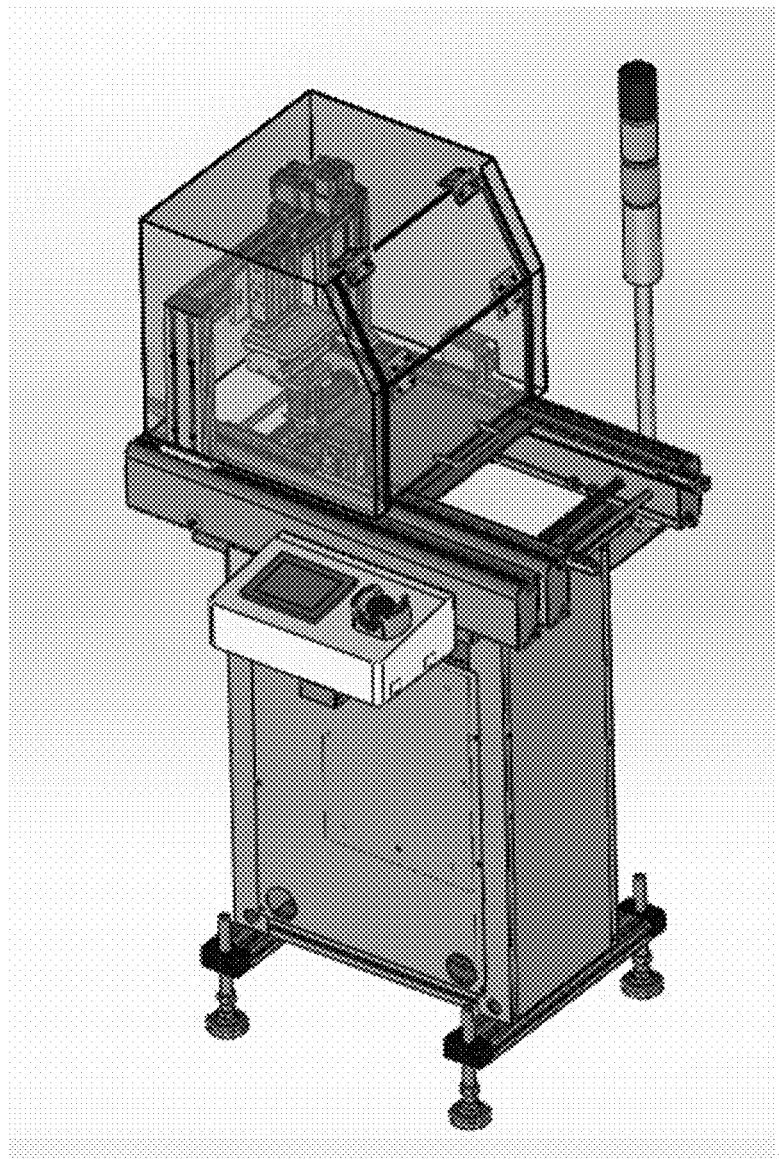
FIG. 24 shows an example embodiment of an unlocking station.

FIG. 24 shows an example embodiment of an unlocking station 105.

Figure 25:
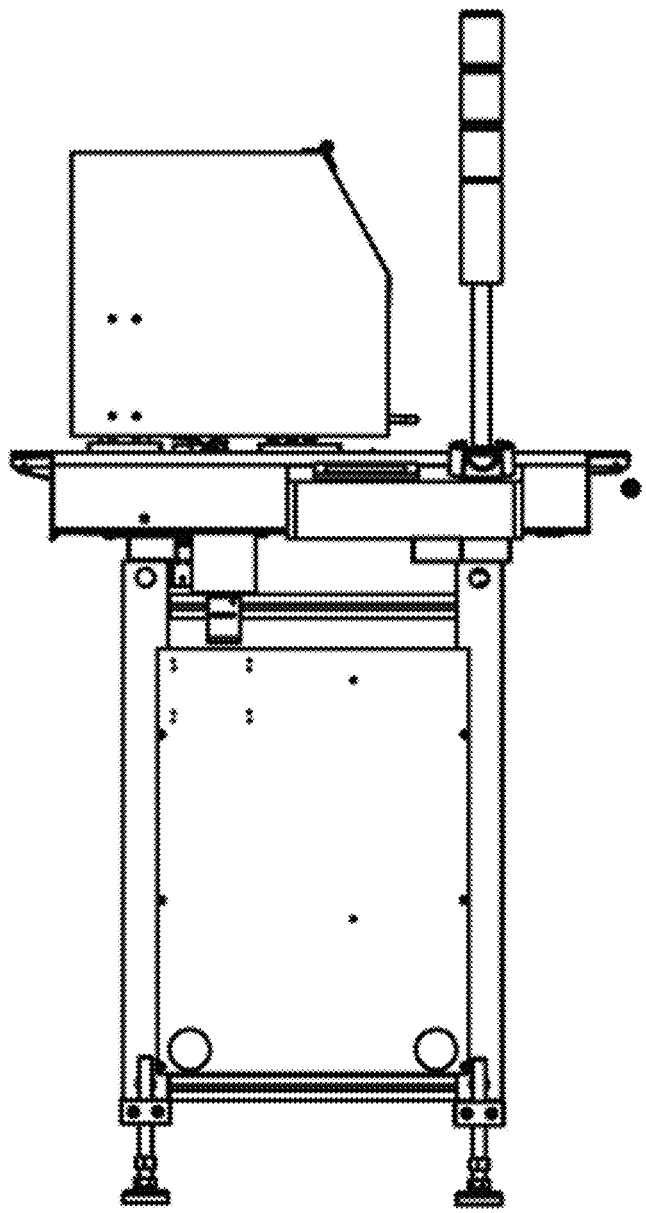
FIG. 25 shows a front elevation view of an example embodiment of an unlocking station.

FIG. 25 shows a front elevation view of an example embodiment of an unlocking station 105.

Figure 26:
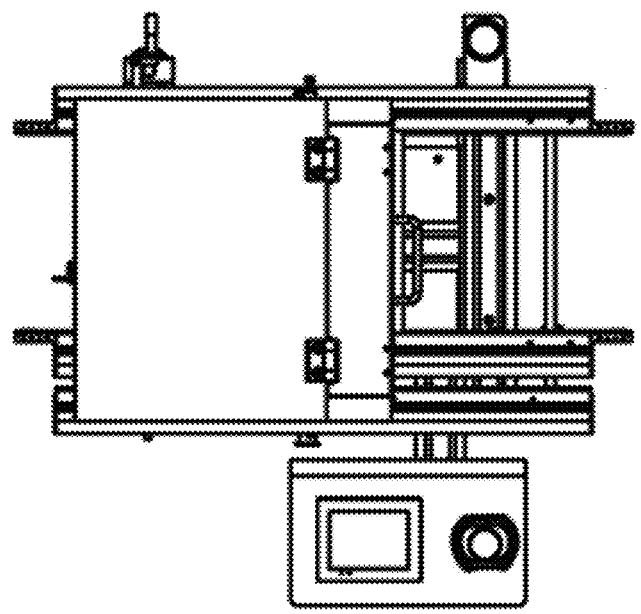
FIG. 26 shows a top elevation view of an example embodiment of an unlocking station.

FIG. 26 shows a top elevation view of an example embodiment of an unlocking station 105.

Figure 27:
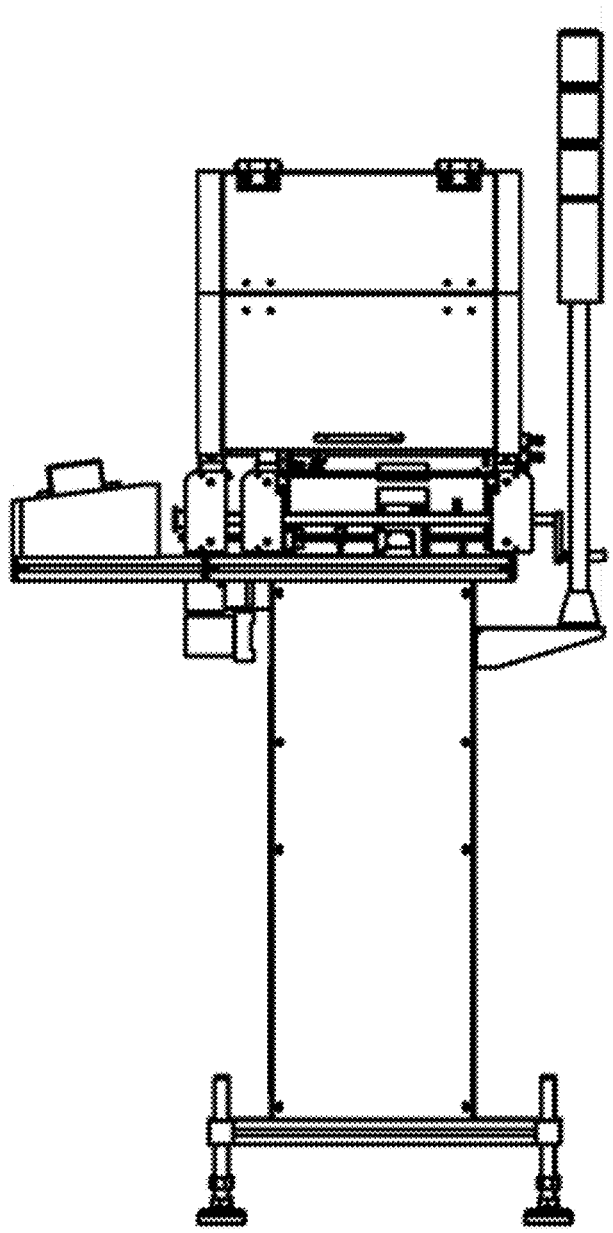
FIG. 27 shows a side elevation view of an example embodiment of an unlocking station.

FIG. 27 shows a side elevation view of an example embodiment of an unlocking station 105.

Figure 28:
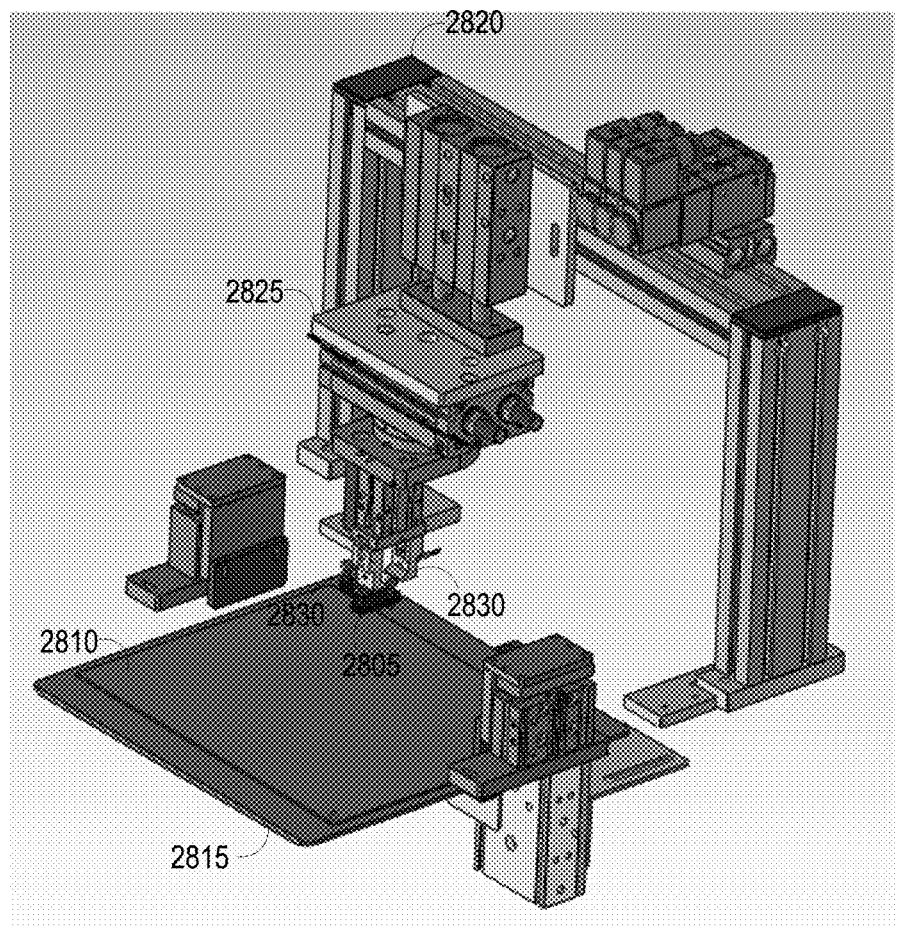
FIG. 28 shows an example embodiment of a clip unlocking mechanism.

FIG. 28 shows an example embodiment of a clip unlocking mechanism 2800. The clip unlocking mechanism 2800 may be within the unlocking station 105 of FIG. 1. The example clip unlocking mechanism 2800 may be operable to unlock a clip 2805 used to temporarily attach a PCB 2810 to a reflow carrier 2815. For example, the clip 2805 may have an arm extending upwards from the PCB/reflow carrier, and the arm may be rotated about an axis to unlock/separate the PCB 2810 from the reflow carrier 2815. In embodiments, the clip unlocking mechanism 2800 may include a track 2820, a rotating arm 2825, and a pair of fingers 2830. When a conveyor moves the PCB/reflow carrier underneath the clip unlocking mechanism 2800, the arm 2825 may be moved along the track 2820 in order to position the fingers 2830 over a clip 2805 used to temporarily attach the PCB 2810 to the reflow carrier 2815. The arm 2825 may then rotate and/or extend to position the fingers 2830 around the clip 2805, the fingers 2830 may close to squeeze the clip 2805, and the arm 2825 may again be rotated about an axis to unlock or disengage the clip 2805. The fingers 2830 may then open to release the clip 2805, and the arm 2825 may return to an initial/default/resting position.

Figure 29:
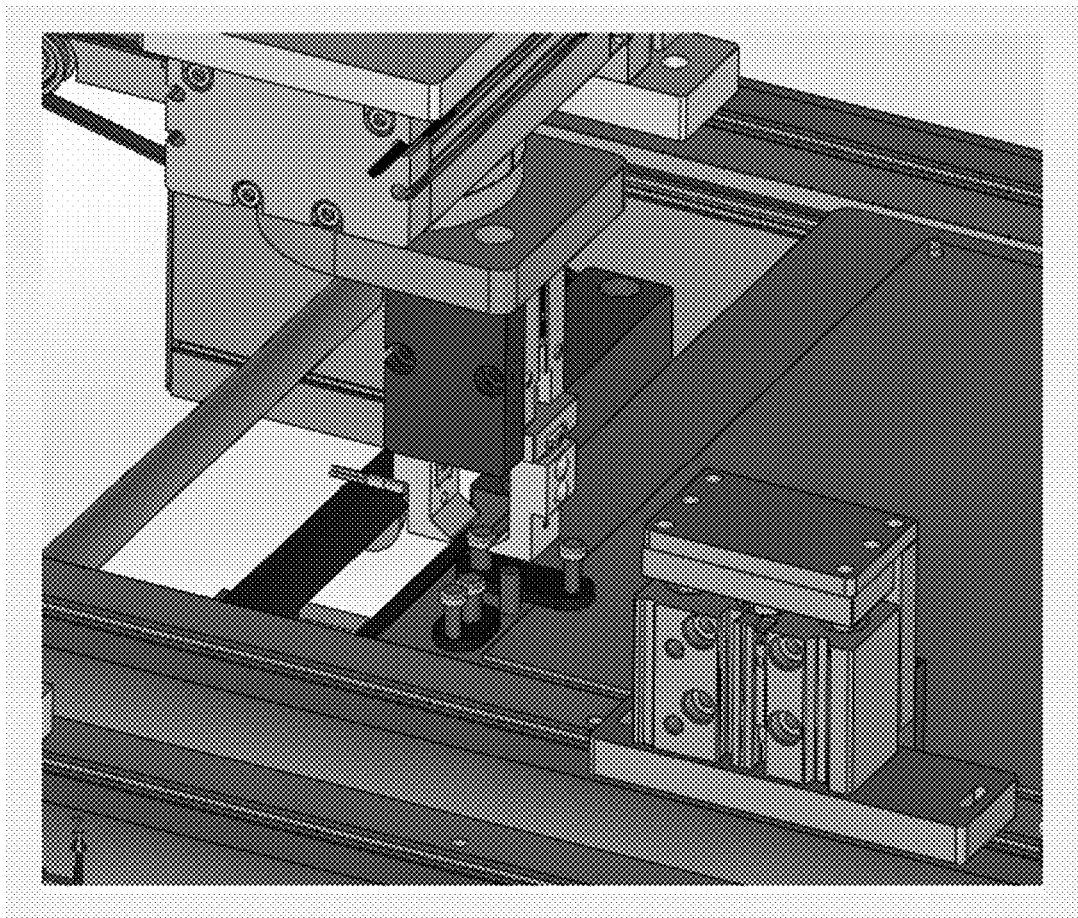
FIG. 29 shows an example embodiment of the fingers.

FIG. 29 shows an example embodiment of the fingers 2830.

It is, of course, not possible to describe every conceivable combination of components or methodologies for purposes of describing the claimed subject matter, but one of ordinary skill in the art can recognize that further combinations and permutations of such matter are possible. Accordingly, the claimed subject matter is intended to embrace all such alterations, modifications and variations that fall within the spirit and scope of the appended claims.

We claim:

1. A system for separating a printed circuit board from a reflow carrier, the system comprising:
    a chamber through which a printed circuit board is passed, wherein the printed circuit board is temporarily attached to a reflow carrier via a clip, and wherein the printed circuit board enters the chamber at a staging area;
    an unlocking mechanism that releases the clip and separates the printed circuit board from the reflow carrier after the printed circuit board exits the chamber;
    a first lifter that elevates the reflow carrier to an overhead conveyor, wherein the overhead conveyor carries the reflow carrier to the staging area.

2. The system of claim 1, further comprising a second lifter that lowers the reflow carrier from the overhead conveyor to the staging area.

3. The system of claim 1, further comprising a pickup mechanism that removes the printed circuit board from the unlocking mechanism.

4. The system of claim 1, wherein the unlocking mechanism comprises one or more fingers that grip an extension of the clip and rotate to detach the printed circuit board from the reflow carrier.

5. The system of claim 1, wherein the first lifter comprises a platform upon which the reflow carrier is placed.

* * * * *